(12) United States Patent
Weale

(10) Patent No.: US 9,847,287 B2
(45) Date of Patent: Dec. 19, 2017

(54) PASSIVE TUNABLE INTEGRATED CIRCUIT (PTIC) AND RELATED METHODS

(71) Applicant: SEMICONDUCTOR COMPONENTS INDUSTRIES, LLC, Phoenix, AZ (US)

(72) Inventor: Gareth Pryce Weale, Phoenix, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 149 days.

(21) Appl. No.: 14/742,301

(22) Filed: Jun. 17, 2015

(65) Prior Publication Data

US 2016/0372417 A1  Dec. 22, 2016

(51) Int. Cl.
| | |
|---|---|
| H01L 23/52 | (2006.01) |
| H01L 23/66 | (2006.01) |
| H01L 23/522 | (2006.01) |
| H01L 49/02 | (2006.01) |

(52) U.S. Cl.
CPC .......... *H01L 23/5223* (2013.01); *H01L 23/66* (2013.01); *H01L 28/75* (2013.01); *H01L 2224/11* (2013.01)

(58) Field of Classification Search
CPC ................. H01L 28/40–28/92; H01L 23/5223
USPC ........................................................ 333/24 C
See application file for complete search history.

(56) References Cited

U.S. PATENT DOCUMENTS

| | | | |
|---|---|---|---|
| 6,476,459 B2* | 11/2002 | Lee ...................... | H01L 23/5223 257/503 |
| 7,012,317 B2* | 3/2006 | Yashima .................. | H01G 4/33 257/295 |
| 7,064,427 B2* | 6/2006 | Chung .................... | H01L 23/50 257/698 |
| 7,781,851 B2* | 8/2010 | Seo ........................ | H01L 23/562 257/178 |
| 8,748,284 B2 | 6/2014 | Tzeng et al. | |
| 9,153,504 B2* | 10/2015 | Lai .......................... | H01L 22/14 |
| 9,171,771 B2* | 10/2015 | Nishi ....................... | H01L 23/36 |
| 2004/0238957 A1 | 12/2004 | Akram et al. | |

(Continued)

OTHER PUBLICATIONS

Vempati Srinivas Rao, et al., Process and Reliability of Embedded Micro-Wafer-Level Package (EMWLP) Using Low Cure Temperature Dielectric Material, IEEE Transactions on Components, Packaging and Manufacturing Technology, vol. 2, No. 1, Jan. 2012.

*Primary Examiner* — Dean Takaoka
*Assistant Examiner* — Alan Wong
(74) *Attorney, Agent, or Firm* — IPTechLaw

(57) ABSTRACT

A passive tunable integrated circuit (PTIC) includes a semiconductor die (die) having a plurality of barium strontium titanate (BST) tunable capacitors. The plurality of BST tunable capacitors collectively define a capacitative area of the die. At least one electrical contact is electrically coupled with the plurality of BST tunable capacitors. A redistribution layer electrically couples the at least one electrical contact with at least one electrically conductive contact pad (contact pad). The at least one contact pad is located over the capacitative area. A bump electrically couples with the at least one contact pad and is located over the capacitative area. An electrically insulative layer couples between each contact pad of the PTIC and the plurality of BST tunable capacitors.

10 Claims, 6 Drawing Sheets

(56) References Cited

U.S. PATENT DOCUMENTS

2006/0291029 A1 12/2006 Lin et al.
2015/0123287 A1* 5/2015 Hsu .................. H01L 21/02057
                                                                257/777

* cited by examiner

PASSIVE TUNABLE INTEGRATED CIRCUIT (PTIC) AND RELATED METHODS

BACKGROUND

1. Technical Field

Aspects of this document relate generally to integrated circuits (ICs) having variable capacitors. More specific implementations involve barium-strontium-titanate (BaSrTiO$_3$) (BST) variable capacitors.

2. Background Art

Variable capacitors allow capacitance to be altered electronically or mechanically. Variable capacitors may be used for impedance matching, to set the resonance frequency in a circuit, and the like. Some variable capacitors include a metal-insulator-metal (MIM) architecture. Some existing MIM capacitors include a barium strontium titanate (BST) layer. Variable capacitors utilizing a BST layer vary capacitance through the application of a voltage.

SUMMARY

Implementations of passive tunable integrated circuits (PTICs) may include: a semiconductor die (die) having a plurality of barium strontium titanate (BST) tunable capacitors, the plurality of BST tunable capacitors collectively defining a capacitative area of the die; at least one electrical contact electrically coupled with the plurality of BST tunable capacitors, and; a redistribution layer electrically coupling the at least one electrical contact with at least one electrically conductive contact pad (contact pad).

Implementations of PTICs may include one, all, or any of the following:

The at least one contact pad may be located at least partially over the capacitative area.

The at least one contact pad may be located substantially over the capacitative area.

The at least one contact pad may be located entirely over the capacitative area.

A bump may be electrically coupled with the at least one contact pad and may be located substantially over the capacitative area.

An electrically insulative layer may be coupled between each contact pad of the PTIC and the plurality of BST tunable capacitors.

The die may not be packaged using a leadframe.

The PTIC may include no active bump that is not located at least partially over the capacitative area.

The PTIC may include no active bump that is not located substantially over the capacitative area.

The PTIC may include no active bump that is not located entirely over the capacitative area.

Implementations of PTICs may include: a semiconductor die (die) having a plurality of barium strontium titanate (BST) tunable capacitors, the plurality of BST tunable capacitors collectively defining a capacitative area of the die, and; at least one bump electrically coupled with the plurality of BST tunable capacitors and located substantially over the capacitative area.

Implementations of PTICs may include one, all, or any of the following:

The at least one bump may be electrically coupled with the plurality of BST tunable capacitors through a redistribution layer (RDL).

The at least one bump may be physically coupled with the plurality of BST tunable capacitors through an electrically insulative layer.

The PTIC may include no active bump that is not located at least partially over the capacitative area.

The PTIC may include no active bump that is not located at least substantially over the capacitative area.

The die may not be packaged using a leadframe.

Implementations of PTICs may include: a semiconductor die (die) having a barium strontium titanate (BST) tunable capacitor; an overlayer coupled over the BST tunable capacitor, and; a redistribution layer electrically coupling at least one electrical contact of the BST tunable capacitor with at least one electrically conductive contact pad (contact pad). The overlayer may include a plurality of holes therethrough, the plurality of holes may be arranged in a reticulation pattern, and each hole may extend through the overlayer from a top surface of the overlayer to a bottom surface of the overlayer. The plurality of holes may be adapted to reduce stress of the overlayer through the reticulation pattern.

Implementations of PTICs may include one, all, or any of the following:

The BST tunable capacitor may define a capacitative area of the die, the at least one contact pad may be electrically coupled with a bump, and the bump may be located at least partially over the capacitative area.

Each active bump of the PTIC may be located substantially over the capacitative area.

Each active bump of the PTIC may be located entirely over the capacitative area.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended passive tunable integrated circuits (PTICs) and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such PTICs and related methods, and implementing components and methods, consistent with the intended operation and methods.

Figure 1:
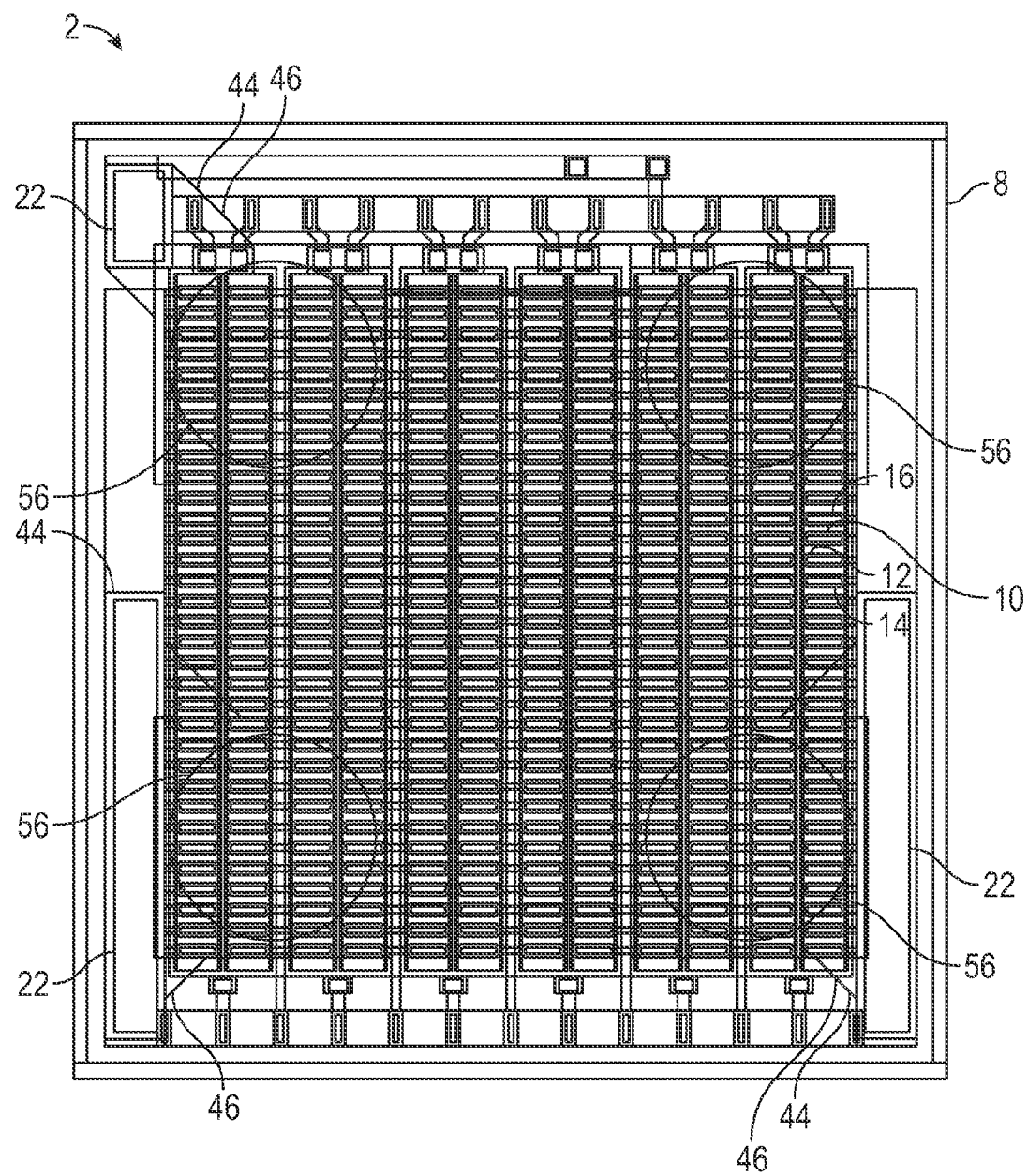
FIG. 1 top see-through view of an implementation of a passive tunable integrated circuit (PTIC)

Referring now to FIG. 1, in implementations a passive tunable integrated circuit (PTIC) 2 includes a semiconductor die 8 which includes a number of variable capacitors 10. In implementations the variable capacitors 10 include one or more of the following: digitally tunable capacitors (DTCs) 12, metal-insulator-metal (MIM) capacitors 14, barium strontium titanate (BST) tunable capacitors 16, and the like. Metal in various implementations also includes generic electrically conductive materials. In the implementations shown in the drawings the variable capacitors are barium strontium titanate (BST) tunable capacitors 16 having BST dielectrics (which are also MIM capacitors 14 and DTCs 12). The BST tunable capacitors 16 may include various barium strontium titanate compounds such as, by non-limiting example: $(Ba,Sr)TiO_3$, $BaSrTiO_3$, $Ba_{0.5}Sr_{0.5}TiO_3$, $Ba_{0.25}Sr_{0.75}TiO_3$, and the like, and may be formed on a sapphire or other crystal and/or ceramic substrate material.

In implementations the capacitance of the PTIC 2 is varied by varying the voltage applied across the BST tunable capacitors. The variable capacitance of PTIC 2 may be utilized, by non-limiting example, for impedance matching, among other uses. PTICs having BST tunable capacitors may be used, for instance, to form part of a matching system used in radio frequency (RF) circuits, for wireless charging matching circuits, and may allow the following properties: continuously variable capacitance, allowance for stable feedback, good linearity performance, good Q performance, and the like.

The plurality of BST tunable capacitors of the semiconductor die collectively define a capacitive area (active area) 18 of the die. An outer perimeter 20 of the capacitive area of the die of PTIC 2 is outlined in FIGS. 2 and 5. A plurality of electrical contacts 22 are included in PTIC 2 which electrically couple with the plurality of BST tunable capacitors. In the implementation shown the electrical contacts 22 lie outside of the outer perimeter of the capacitive area or, in other words, they are not located "over" the capacitive area. The electrical contacts may include, by non-limiting example, metallic or other electrically conductive material that is in electrical connection/communication with the variable capacitors.

Figure 2:
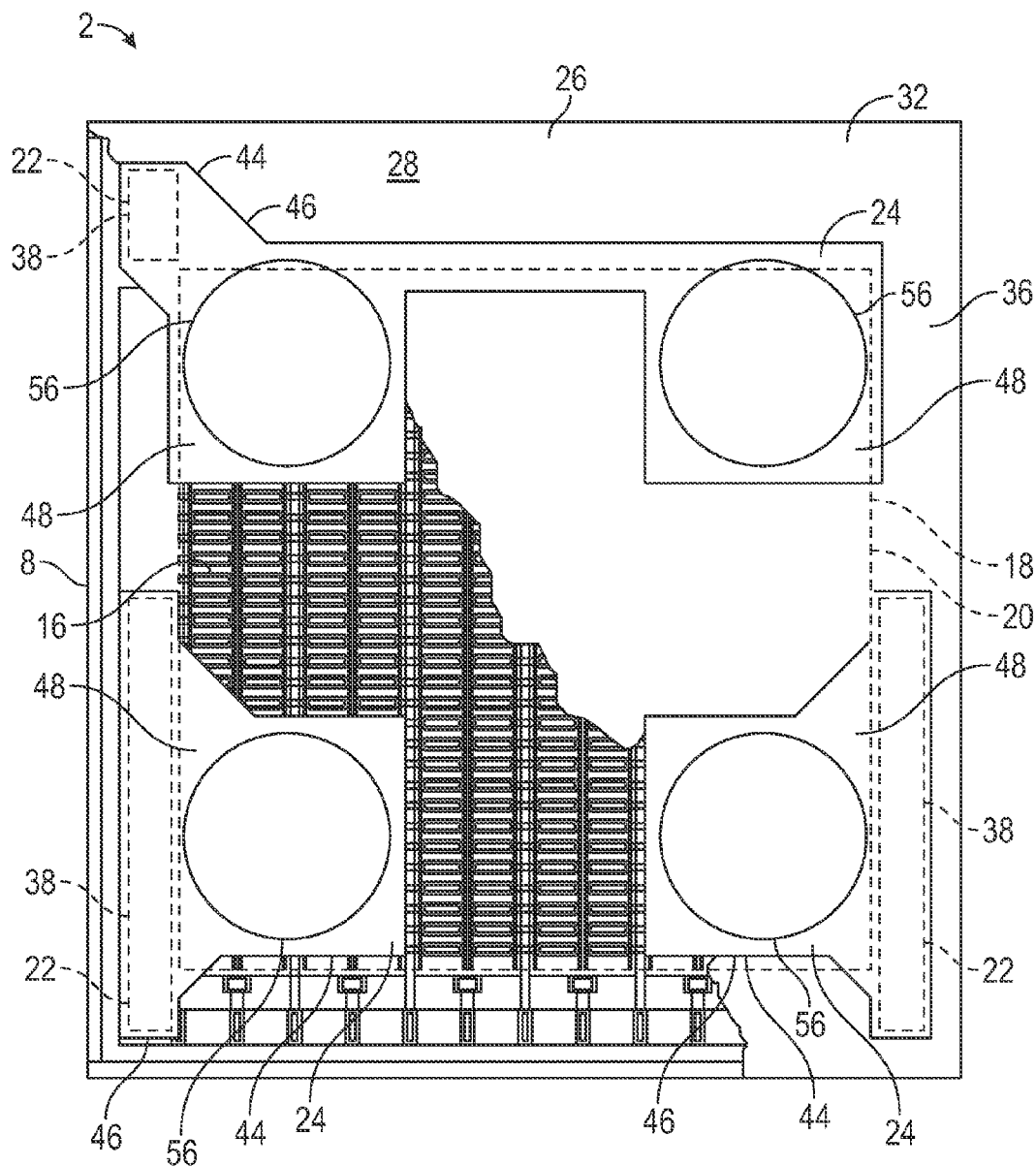
FIG. 2 is top partial see-through, partial cutaway view of the PTIC of FIG. 1.

Referring to FIG. 2, PTIC 2 includes at least one redistribution layer (RDL) 24. The redistribution layer in the implementations shown includes at least one electrically conductive layer 44 and at least one electrically insulative layer (dielectric layer) 32. A first electrically insulative layer is first deposited over the capacitive area and, in implementations over the entire top surface of the die (which is the surface of the die facing out of the page in FIGS. 1-2). In implementations the electrically insulative layer is formed of polyimide 36, though in other implementations it could include some other electrically insulative material, such as a polymer or ceramic material and the like.

A plurality of contact openings 38 are formed in the first electrically insulative layer 32, each corresponding with one of the aforementioned electrical contacts 22. In the figures the contact openings are bounded (surrounded) by the electrically insulative layer on their sides, but in other implementations one or more contact openings could be formed at the edges of the die so that the electrically insulative layer forms a boundary only around a portion of the contact (the other portion(s) remaining unbounded at the edge(s) of the die).

The contact openings could be formed, by non-limiting example, by using photolithography and etching processes, and the like. In implementations the electrically insulative layer itself is formed of a photosensitive/photosensitized polymeric material, thus facilitating the removal of portions of it through a exposure and develop process. In other implementations the electrically insulative layer may not be formed of a photosensitive/photosensitized material but a photoresist material may be coated thereon, exposed, and then removed at certain locations to expose portions of the electrically insulative material. The exposed electrically insulative material may then etched to form the desired contact openings, and then the remainder of the photoresist is removed.

Once the first electrically insulative layer has been deposited and the contact openings formed, the electrically conductive layer 44 may be deposited thereon. The electrically conductive layer 44 may be formed in such a way that it entirely covers the electrically insulative layer and then portions may be removed (such as through etching and/or other material removal techniques) to form the metallic traces 46 and electrically conductive contact pads (contact pads) 48 as shown in FIGS. 1-2. In other implementations plating procedures may be used to selectively deposit the conductive material on only portions of the electrically insulative layer to form the metallic traces and electrically conductive contact pads without needing to coat the entire insulative layer and then remove portions of the electrically conductive layer.

In some implementations, a solder or copper bump (bump) 56 could be placed directly atop the electrically conductive contact pad 48. The illustrations shown in FIGS. 1-5 illustrate implementations where this is the case. In such implementations there may be only a single electrically insulative layer and only a single electrically conductive layer forming the redistribution layer (atop the capacitive area). In other implementations, the redistribution layer may include more than one electrically conductive layer. As can be seen from the drawings, the contact pads 48 and the solder bumps 56 are located over the capacitive area. The user may easily envision an implementation wherein the redistribution layer is such that the solder bumps and/or contact pads are located only partially over the capacitive area 18 (i.e., only partially within the outer perimeter 20 defined by the capacitive area). The redistribution layer could be designed so that the contact pads and/or solder bumps are substantially over the capacitive area (or substantially within the outer perimeter). The redistribution layer could also be designed so that the contact pads and/or solder bumps are entirely over the capacitive area (or entirely within the outer perimeter). In the implementations illustrated, the bottom two solder bumps and contact pads are entirely over the capacitive area and entirely within the outer perimeter, while the top two solder bumps and contact pads are substantially over the capacitive area and substantially within the outer perimeter. In all cases shown in the drawings all contact pads and solder bumps are entirely over the die and entirely within the outer edges of the die. The electrically insulative layer is coupled between each contact pad and/or solder bump of the PTIC and the plurality of BST tunable capacitors.

Some conventional PTICs are fabricated with a bump on die approach, but the solder bumps are placed on a location of the die that is not over the capacitive area. Some conventional PTICs use quad-flat no-leads (QFN) packaging in which a bumped die is flipped onto a QFN leadframe but, again, the solder bumps are not located over the capacitive area. Thus, in conventional PTIC implementations, some wafer/die area is used for the capacitive area and some is used for the solder bumps/interconnects, but there is no overlap, which results in more wafer/die area being needed. Some conventional PTICs use electroless nickel/immersion gold (ENIG) bumps on a planar die but, with these, as with those conventional die described above, there are die size limitations because the bumps are not placed over the capacitative area and some die area must thus be set aside for the interconnects/bumps instead of for capacitative area.

While many variations using the principles disclosed herein can be made by those of ordinary skill, forming the redistribution layer(s) in such a way so that the solder bumps and contact pads are partially, substantially, or entirely over the capacitative area 18 (and partially, substantially, or entirely within the outer perimeter 20, respectively) may allow for one, all, or any combination of the following: a smaller die size, a smaller package size, a more efficient layout, smaller bump pitch, no leadframe, no wirebonds, no need to use a quad-flat-no-leads packaging structure; the lack of copper pillar bumps over PTIC level metal (solder or copper bumps may instead be placed over the capacitative area); the lack of bumps over PTIC level metal (bumps may instead be placed over the capacitative area), less wafer space (as most or all of the wafer space is generally used for the capacitative/active area and not for interconnections), and lower overall total cost of production per die. In implementations the die size may be increased and/or decreased as compared to die sizes for conventional PTICs because there is not significant area additional to the capacitative area that needs to be occupied by one or more bumps and underlying metal beneath the one or more bumps (in other words, there is little or no space on the PTICs disclosed herein which needs to be allocated solely for bumps and/or contact pads/interconnects and that is not "shared" by the capacitative area). The ability to place the bumps/electrical contact pads/other electrical connections directly over the capacitative area may also allow for other shapes/configurations for the capacitative area, such as square (or more square), wider or thinner, taller or shorter, etc.

In implementations where there is only one electrically insulative layer and only one electrically conductive layer, there is only one redistribution layer. In other implementations there could be multiple electrically insulative layers and/or multiple electrically conductive layers forming a single redistribution layer and/or forming more than one redistribution layer.

Figure 6:
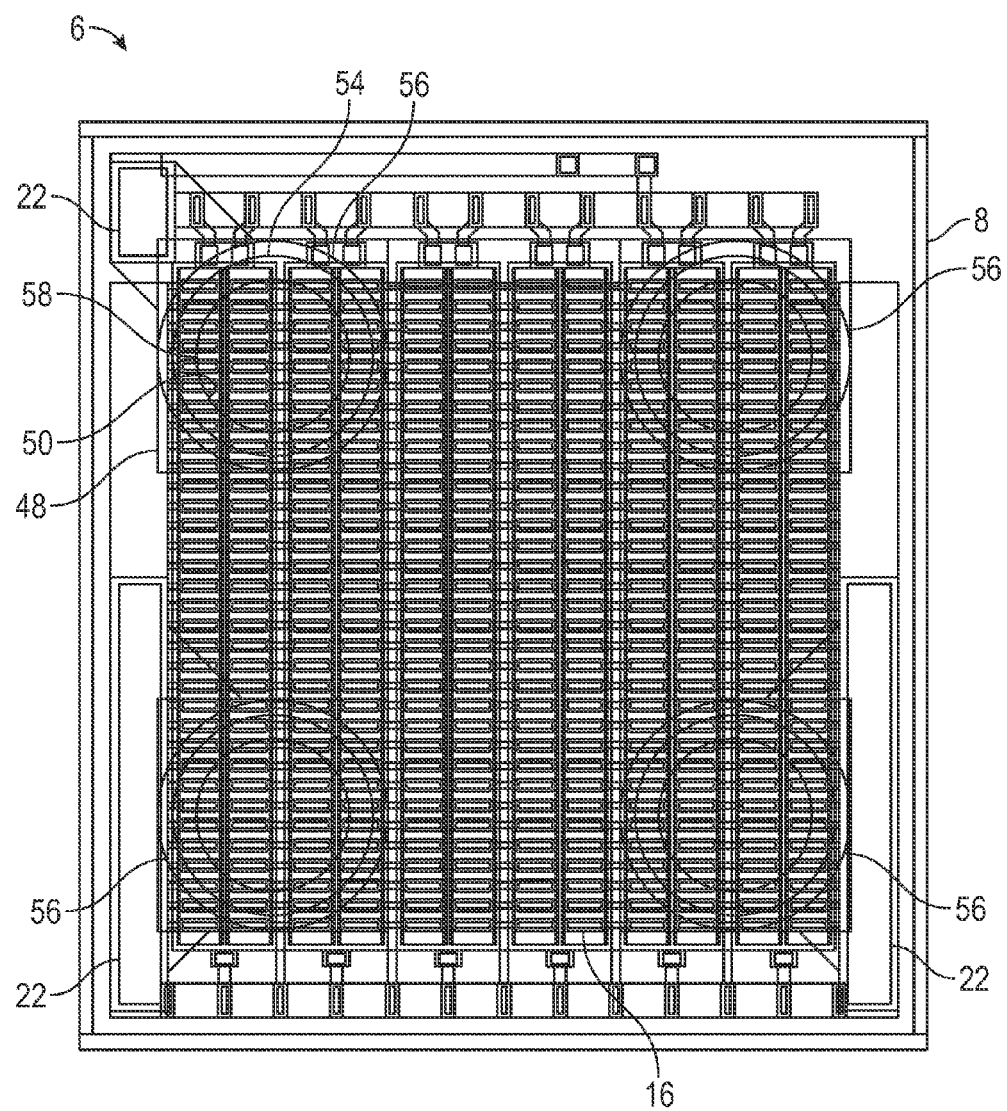
FIG. 6 is a top view of another implementation of a PTIC.
Figure 7:
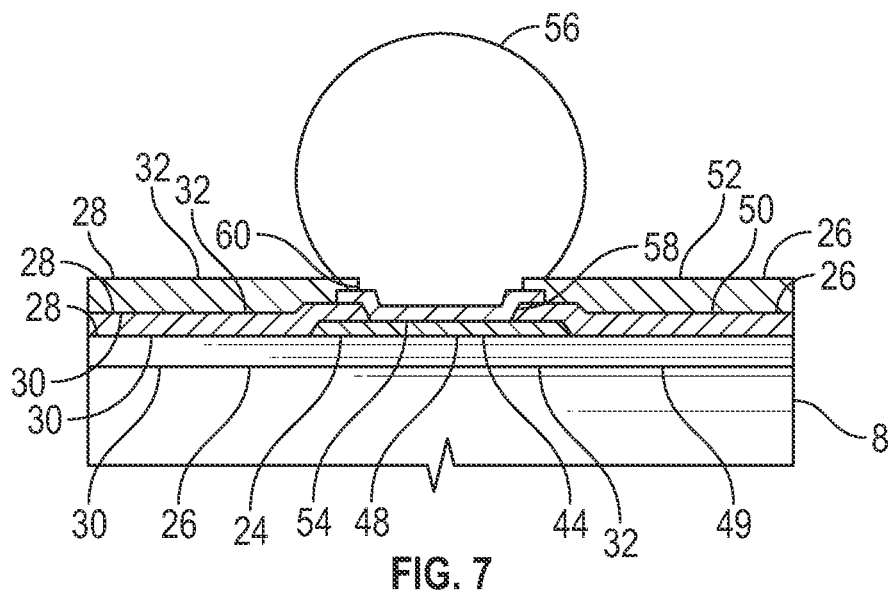
FIG. 7 is a side cross-section view of a portion the PTIC of FIG. 6.

FIGS. 6-7 show an implementation of a PTIC 6. FIG. 6 is shown in see-through format and the third passivation layer 52, which is shown in FIG. 7, is omitted in FIG. 6 for ease in viewing the remaining elements. PTIC 6 includes a first electrically insulative layer 32 (first passivation layer 49) deposited atop the die 8 and a contact pad 48 located atop the first passivation layer and in electrical communication with one or more of the variable capacitors of the die. A second electrically insulative layer 32 (second passivation layer 50) is then deposited over the contact pad and the first electrically insulative layer, and an opening 58 is made therein so that a portion, but not all, of the contact pad is exposed therethrough. Under bump metallization (UBM) 54 is then deposited in such a way that it physically contacts the exposed area of the contact pad and is in electrical communication with the contact pad. A third electrically insulative layer 32 (third passivation layer 52) may then be deposited over the second passivation layer and the UBM, and then a portion of the third passivation layer may be removed to expose a portion, but not all, of the UBM 54, forming opening 60. In various implementations, third passivation layer 52 may be omitted. A solder bump 56 is deposited onto the UBM 54 and, in some cases, contacts the third passivation layer 52, as seen. Copper bumps could also be deposited in various implementations. The removal of portions of each passivation layer, such as to make openings, may be done through etching and other patterning techniques. Any of the overlayers 26 may be formed of polyimide 36, but one or more or all could also be formed of another polymer, or a non-polymer such as a ceramic, or some other passivation material such as SiN.

Thus, in various implementations, multiple passivation layers and/or electrically insulative layers, electrically conductive layers, under bump metallization, and the like all may form a part of one or more redistribution layers, while in other cases there may be only a single electrically insulative layer and a single electrically conductive layer forming the redistribution layer. When the first electrically conductive layer is formed, it contacts the electrical contacts 22 through the contact openings 38. In cases where multiple electrically conductive layers are used there may be contact openings (vias) formed in each electrically insulative layer (passivation layer) for the multiple layers of conductive material to be in electrical communication with one another through the electrically insulative layers. As can be seen in the drawings, each electrically conductive layer may have various discrete portions that are electrically isolated from one another at least at the level of the electrically conductive layer. For example FIGS. 3 and 5 each show three separate metallic traces 46—one at the top of the figure and located beneath two solder bumps and two at the bottom of the figure and each located beneath a single solder bump. Each discrete portion may accordingly be electrically coupled with different portions or elements of the BST tunable capacitors 16, the PTIC, and the like.

Each of the bumps illustrated in the drawings is an "active" bump, which is defined herein as a bump which is electrically coupled with one or more of the variable capacitors or with some other electrical element of the PTIC. Each of the PTICs shown in the drawings has four bumps, but any other number could be used on a PTIC depending, at times, in part on the die size, the number of variable capacitors, and the like. There may therefore, in implementations, be more than four or less than four active bumps, or more or less than four total bumps. There may be implementations of PTICs wherein not all bumps are active bumps, but where one or more are placed not for electrical connection but instead for structural symmetry and physical stability (i.e., so that there are no bump locations "missing" a bump). In such cases any inactive bumps may be referred to as "dummy" bumps and may be entirely electrically isolated from electrical components of the die, such as the variable capacitors, BST tunable capacitors, and the like. These dummy bumps may allow a PTIC to have structural integrity, to sit level on a motherboard or printed circuit board (PCB), to have less physical stress than could be present with less bumps, and the like.

In implementations, as those shown in the drawings, the PTIC includes no active bump that is not located at least substantially over the capacitative area. In other implementations the PTIC may include no active bump that is not located at least partially over the capacitative area. In other implementations the PTIC may include no active bump that is not located entirely over the capacitative area. As is described herein and as is shown in the drawings, in implementations of PTICs at least one bump is electrically coupled with the plurality of BST tunable capacitors through a redistribution layer (RDL). As is also shown and described herein, at least one bump is physically coupled with the plurality of BST tunable capacitors through an electrically insulative layer.

Conventional PTICs have included an overcoat or overlayer that is used as a protective layer to protect the die, the variable capacitors, and the like from damage. In implementations BST based PTICs have included one or more overlayers as passivation over the BST capacitor structure. These overlayers in conventional PTICs have been used for protective purposes but have also caused undesired stresses in the die. In various implementations, these overlayers are the same as one or more of the electrically insulative layers discussed herein. The use of protective polyimide overlayers in conventional BST capacitor-based PTIC devices, for instance, has caused significant stress-related issues in some PTICs. The dielectric layers/overlayers may, for example, cause detrimental curvature, tuning range differences, modified acoustic resonance, leakage difference, and capacitive value differences.

In implementations of PTICs disclosed herein, the redistribution layer(s) may fulfill the functions of the protective overcoats/overlayers that have been used in conventional PTICs. Conventional PTICs have not included redistribution layers.

Figure 3:
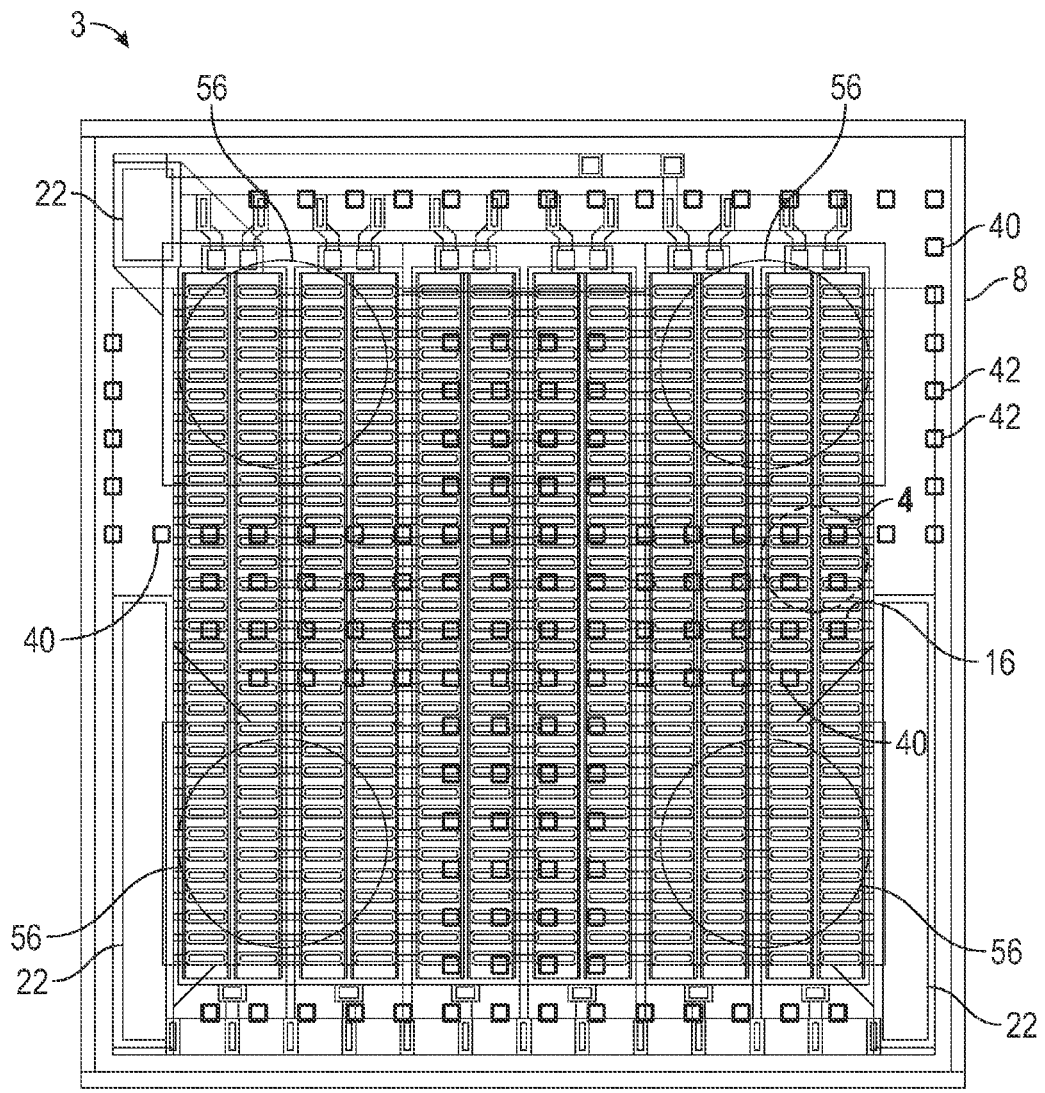
FIG. 3 is top see-through view of another implementation of a PTIC.
Figure 4:
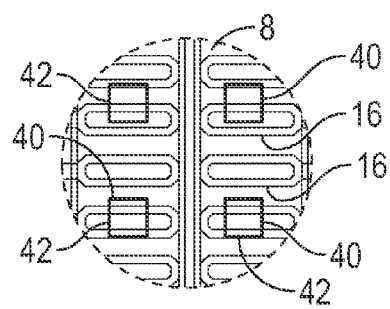
FIG. 4 is a close-up view of a portion of the PTIC of FIG. 3 denoted by the reference numeral 4.
Figure 5:
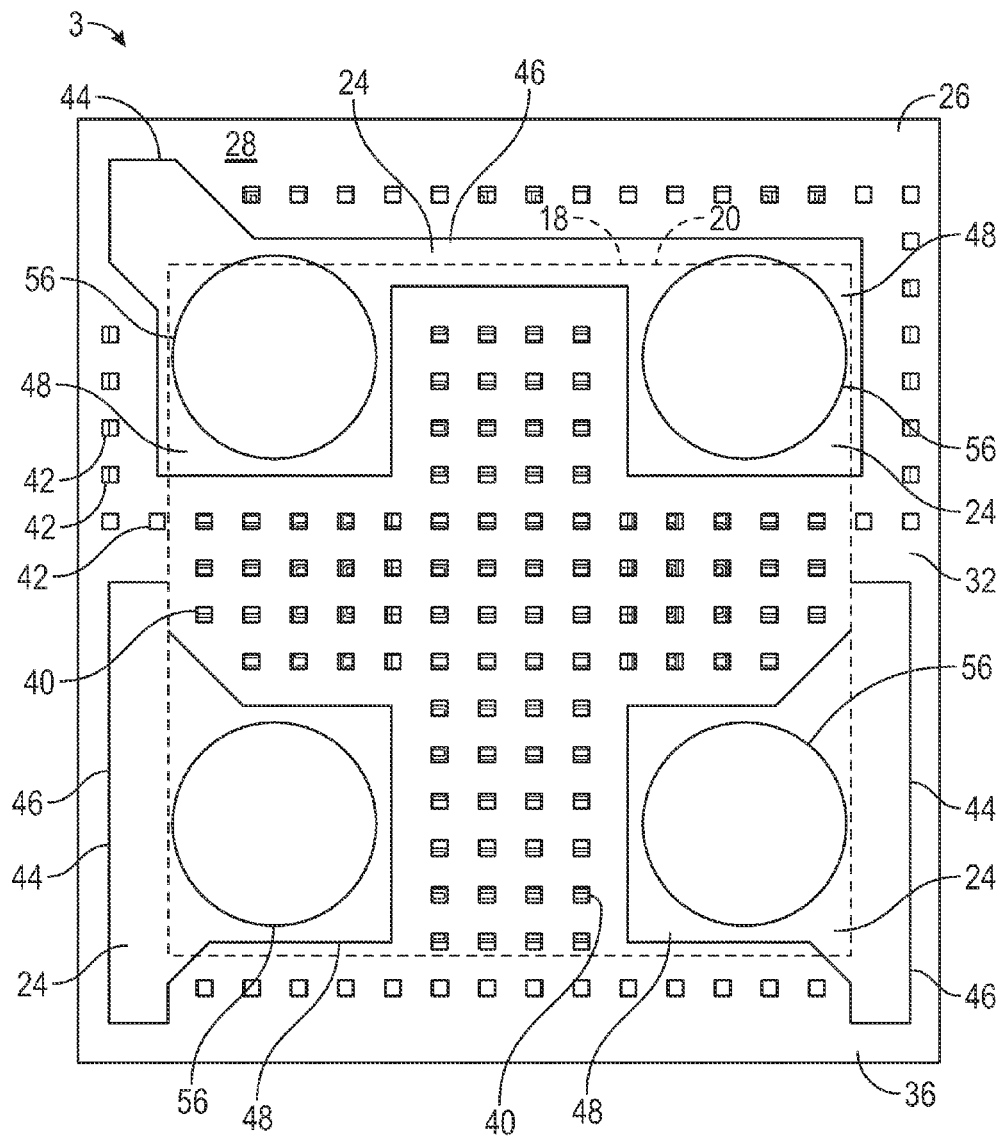
FIG. 5 is a top view of the PTIC of FIG. 3.

FIGS. 3-5 show a version of a PTIC 4 which includes a reticulation pattern 42 of holes 40 in overlayer 26. Each hole 40 in the reticulation pattern extends from a top surface 28 through to a bottom surface 30 of the overlayer 26. The reticulation pattern provides stress relief at each hole so that the PTIC is not curved under stress, or not curved as much as it would otherwise be without the stress relief caused by the holes. Then tension relief at the hole edges increases the flexibility of the overlayers. The reticulation pattern shown in the drawings includes a pattern of generally equally spaced holes arranged in equally spaced rows and columns, wherein the rows are set at 90 degrees to the columns and wherein the rows and columns are also aligned with outer edges of the die, respectively. In other implementations other reticulation patterns could be used, such as a star or spoke pattern extending outwardly from a center of the die, a spiral pattern, an angular or slanted pattern wherein each row or column is offset and/or not aligned with its neighboring row/column, a wavy or curvy pattern, a non-uniform random pattern, a higher concentration of holes towards the center and a lower concentration towards the edges (or vice-versa) to achieve uniform stress throughout the die (according to the specific stress characteristics of the die— for example if the die has greater stress at the edges than in the center more reticulation holes could be included towards the edges, and vice-versa), and the like.

The phrase "reticulation pattern" as used herein is not limited to a "network" of holes, as none of the holes shown in the drawings are "networked" with any of the other holes—though in implementations the reticulation pattern could include such a network. As shown in the drawings, in implementations of reticulation patterns each hole is isolated/separated from all of the other holes by the material of the insulative layer. The phrase "reticulation pattern" as used herein is also not limited to only "regular" or "repeating" patterns but, as described above, includes random patterns/arrays of holes. Nevertheless, as described above, in some implementations the reticulation pattern may include a regular, repeating pattern, and such a regular repeating pattern may be easier and less costly to implement, in general, than a non-regular pattern, though a non-regular pattern may have the advantage of achieving a more homogenous stress profile for some implementations of PTICs, as described above.

Reticulation patterns of stress-relief holes have been used in overlayers deposited on large wafers where backgrinding is used, to prevent curling of the thinned wafers.

The holes 40 shown in the drawings have a square cross section facing out of the page (and therefore a cuboidal shape which may be a cube or a non-cubic right rectangular cuboid), but in other implementations the holes could have: a circular cross section facing out of the page and a cylindrical three-dimensional shape; a circular, elliptical or oval cross section facing out of the page and a spherical, ellipsoid, or ovoid three-dimensional shape, respectively; a triangular cross section facing out of the page and a triangular prismatic three-dimensional shape; a cross section of any regular or irregular polygon facing out of the page and a corresponding prismatic three dimensional shape, and/or; any other regular or irregular closed shape cross section facing out of the page and regular or irregular three-dimensional shape.

As FIG. 7 shows, any layer laid down over the die may be an overlayer 26. In FIG. 7 the first electrically insulative layer 32 (first passivation layer 49) laid over the die 8 is an overlayer 26, the second electrically insulative layer 32 (second passivation layer 50) is an overlayer 26, and the third electrically insulative layer 32 (third passivation layer 52) is also an overlayer 26. Any and/or all of these layers may have a reticulation pattern therein to reduce stress that may be caused on the die by the layer(s).

Where there are multiple passivation and/or electrically insulative layers, the reticulation pattern may include holes which align and pass through all of the passivation and/or electrically insulative layers. For instance the holes could all be formed through chemical or plasma etching or other material removal techniques after all the overlayers are laid down, and the holes could be etched all the way through each layer (from the top surface 28 of the topmost layer to the bottom surface 30 of the bottommost layer) all the way to the die. In other implementations the holes of individual layers may not need to align to provide proper stress relief, and so each layer could have its own reticulation pattern that does not align with the reticulation pattern(s) of any other layer. In such implementations a reticulation pattern may be formed in an individual layer after that layer is deposited but before another layer is deposited thereon—and so forth with a reticulation pattern being formed in each electrically insulative layer after it is deposited and before the next layer is deposited. As reticulation patterns in individual layers could vary, the reticulation pattern in any specific layer could be tailored according to the specific stress profile of that layer, and could be designed with the aid of stress-modeling software taking into account interactions between layers, the die, and the like.

In PTIC implementations including one or more redistribution layers (RDLs) the passivation layer(s) and/or overlayer(s) may include materials generally used for (or otherwise suitable for) RDL and bump construction.

In places where the description above refers to particular implementations of PTICs and related methods and implementing components, sub-components, methods and sub-methods, it should be readily apparent that a number of modifications may be made without departing from the spirit thereof and that these implementations, implementing components, sub-components, methods and sub-methods may be applied to other PTICs and related methods.

What is claimed is:

1. A passive tunable integrated circuit (PTIC) comprising:
 a semiconductor die (die) having a barium strontium titanate (BST) tunable capacitor;
 an overlayer coupled over the BST tunable capacitor, and;
 a redistribution layer electrically coupling at least one electrical contact of the BST tunable capacitor with at least one electrically conductive contact pad (contact pad);
 wherein the overlayer comprises a plurality of holes therethrough, the plurality of holes arranged in a reticulation pattern, each hole extending through the overlayer from a top surface of the overlayer to a bottom surface of the overlayer, and;
 wherein the plurality of holes are adapted to reduce stress of the overlayer through the reticulation pattern.

2. The PTIC of claim 1, wherein the BST tunable capacitor defines a capacitative area of the die, wherein the at least one contact pad is electrically coupled with a bump, and wherein the bump is located at least partially over the capacitative area.

3. The PTIC of claim 2, wherein each active bump of the PTIC is located substantially over the capacitative area.

4. The PTIC of claim 3, wherein each active bump of the PTIC is located entirely over the capacitative area.

5. The PTIC of claim 1, wherein the die is not packaged using a leadframe.

6. The PTIC of claim 1, wherein an electrically insulative layer is coupled between each contact pad of the PTIC and the BST tunable capacitor.

7. The PTIC of claim 2, wherein the at least one contact pad is located at least partially over the capacitative area.

8. The PTIC of claim 7, wherein the at least one contact pad is located substantially over the capacitative area.

9. The PTIC of claim 8, wherein the at least one contact pad is located entirely over the capacitative area.

10. The PTIC of claim 2, wherein the bump is physically coupled with the BST tunable capacitor through an electrically insulative layer.

* * * * *